(12) United States Patent
Jaisinghani et al.

(10) Patent No.: US 7,382,064 B2
(45) Date of Patent: Jun. 3, 2008

(54) SUPPLY VOLTAGE IDENTIFIER

(75) Inventors: Pooja Jaisinghani, Greater Noida (IN);
Tapas Nandy, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 139 days.

(21) Appl. No.: 11/296,589

(22) Filed: Dec. 6, 2005

(65) Prior Publication Data

US 2006/0202561 A1    Sep. 14, 2006

(30) Foreign Application Priority Data

Dec. 6, 2004    (IN) .............................. 2440/2004

(51) Int. Cl.
*H02J 1/00*    (2006.01)
(52) U.S. Cl. ...................................... 307/87

(58) Field of Classification Search ................... 307/87
See application file for complete search history.

(56) References Cited

U.S. PATENT DOCUMENTS 7,242,111 B2 *    7/2007    Menas et al. .................. 307/38

* cited by examiner

*Primary Examiner*—Robert L. DeBeradinis
(74) *Attorney, Agent, or Firm*—Lisa K. Jorgenson; Bryan A. Santarelli; Graybeal Jackson Haley LLP

(57) ABSTRACT

A supply identifier takes precise decision on the range of the external supply to manage a proper internal supply to the core of the IC by controlling a regulator or a switch connected to external supply. This supply identifier defers the decision until everything that influences the decision settles after power-up, then makes a decision only once depending on the external supply range and switches itself off, keeping the decision stored, to avoid noise-induced wrong behavior and to reduce power consumption.

34 Claims, 5 Drawing Sheets

Block Diagram of Supply management

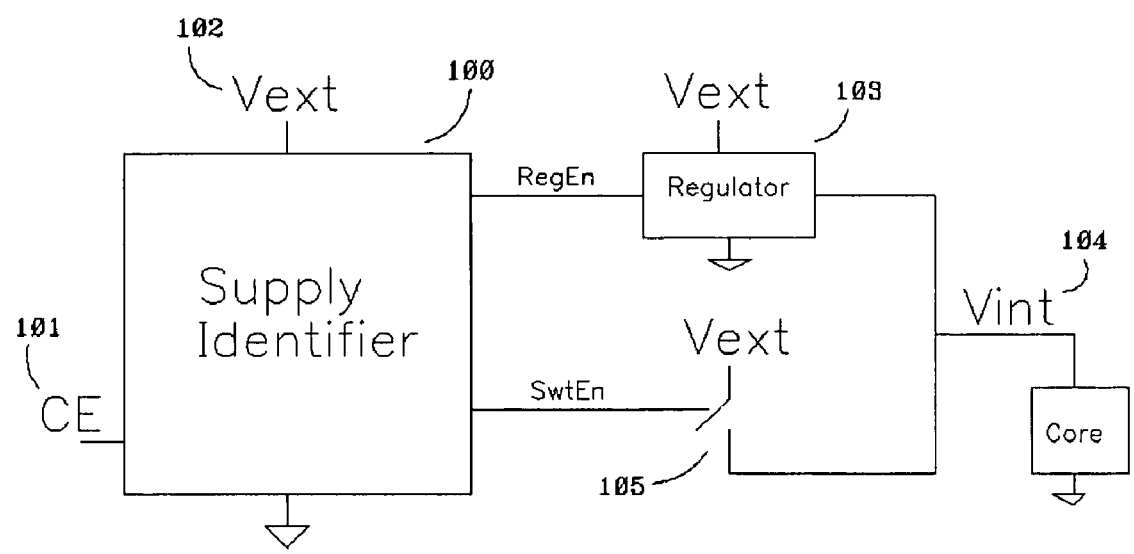
Fig 1 : Block Diagram of Supply management

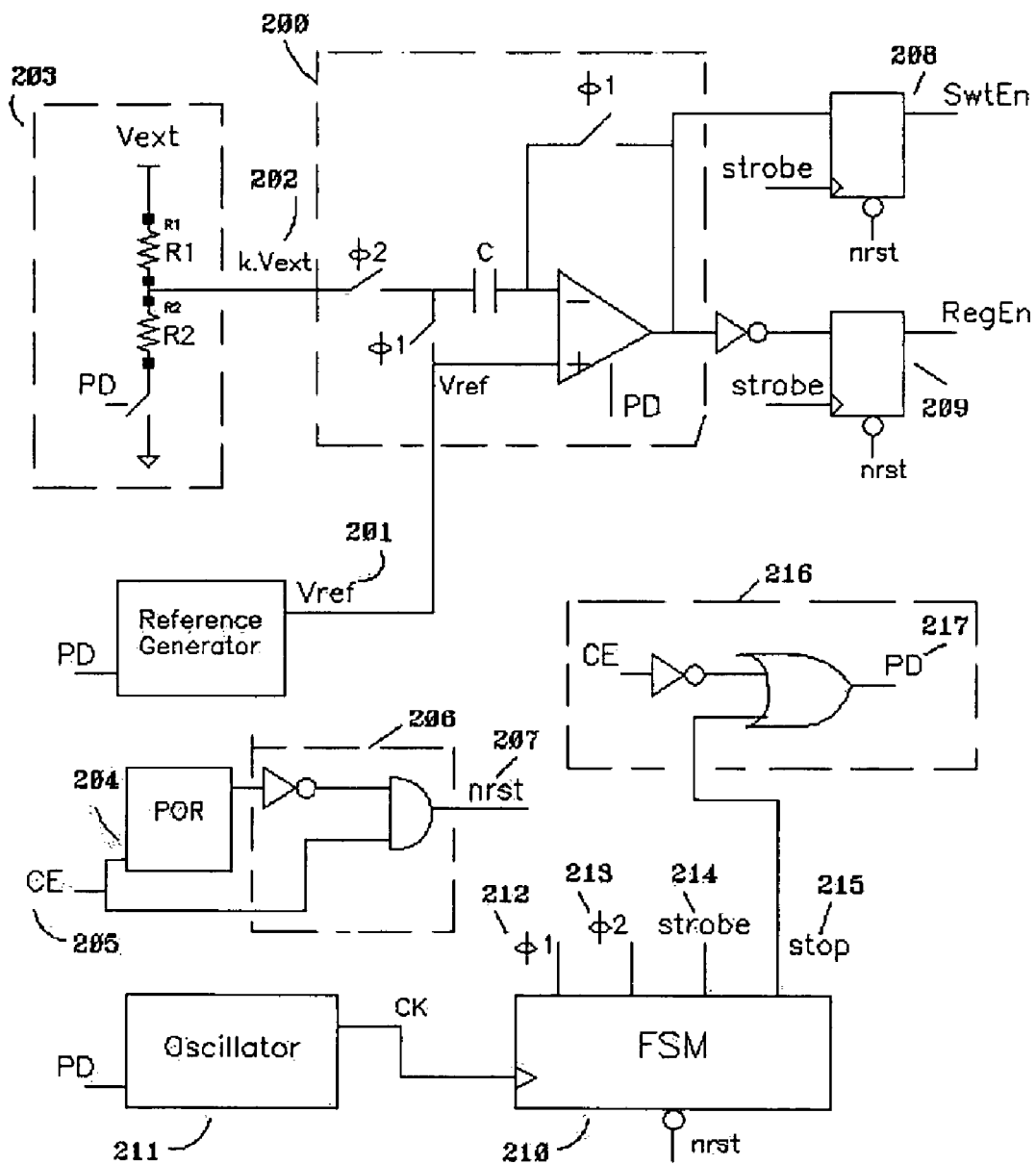
Fig 2 : Detailed circuit of Supply Identifier

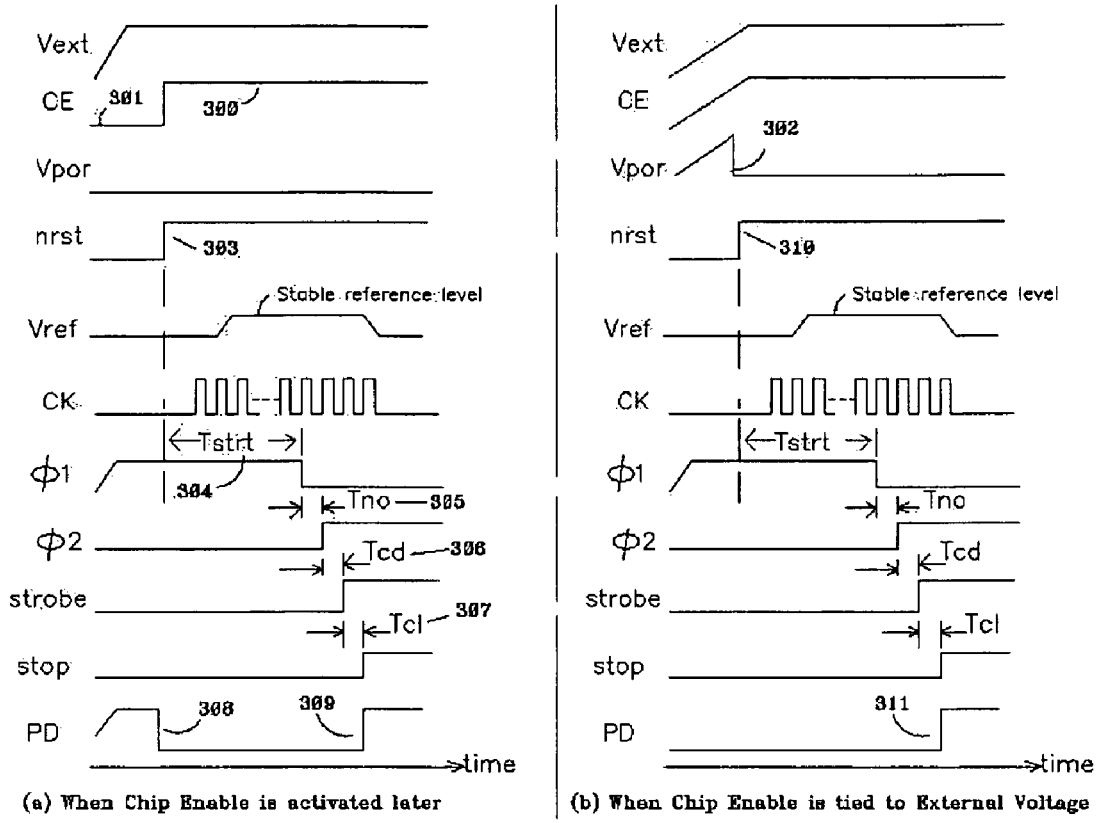
Fig 3 : Control signals of Supply Identifier

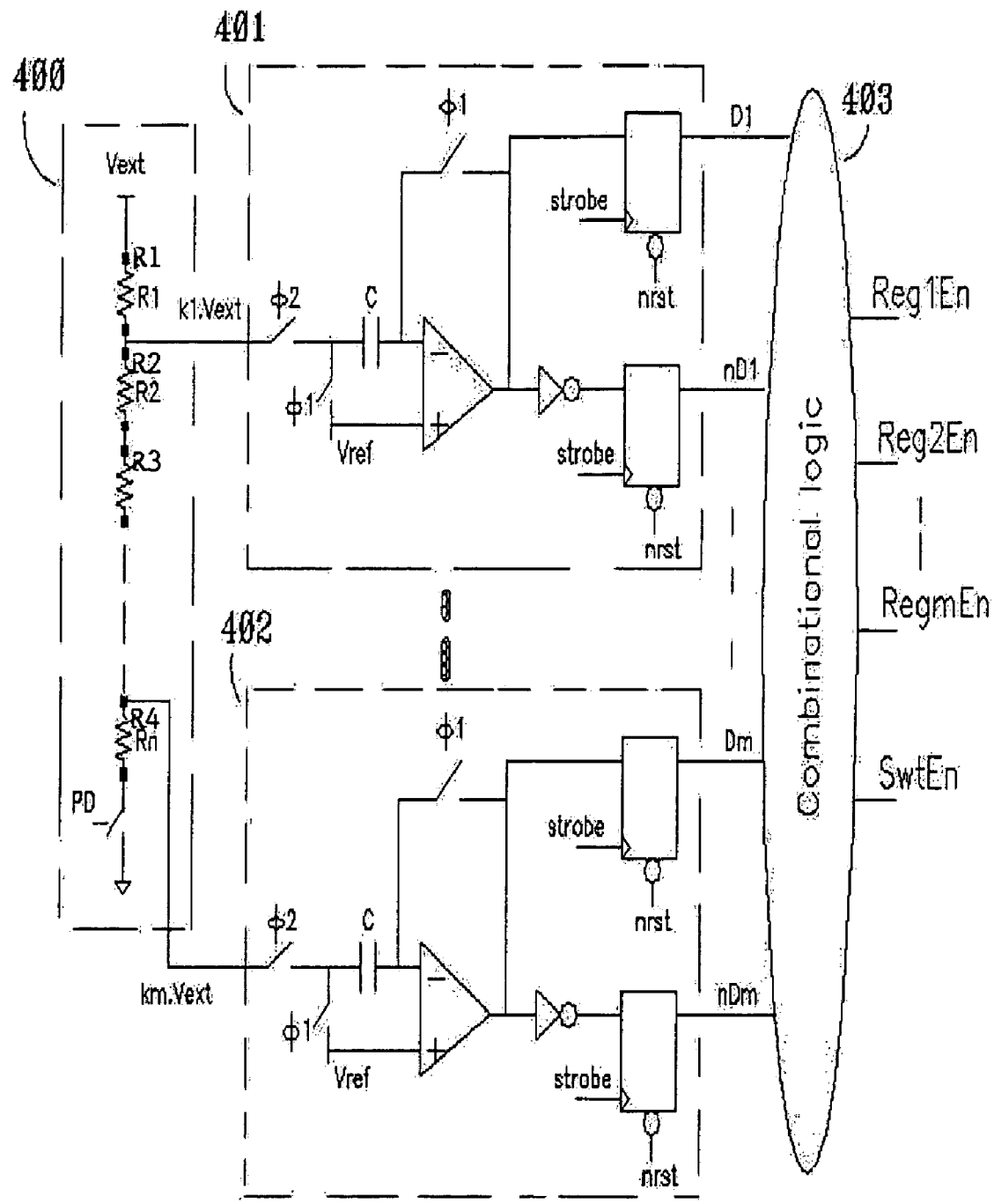
Fig 4 : Multiple supply range identification

SUPPLY VOLTAGE IDENTIFIER

PRIORITY CLAIM

This application claims priority from Indian patent application No. 2440/Del/2004, filed Dec. 6, 2004, which is incorporated herein by reference.

TECHNICAL FIELD

The present invention generally relates to a supply-voltage identifier circuit.

BACKGROUND

Conventional integrated circuits operate on dual voltages, the lower voltage being in the core side in the range 1.8 v, 1.2 v or 1.0 v. External voltages are available in ranges of 5 v, 3.3 v, 2.5 v, 1.8 v, 1.2 v. An existing method for supplying different ranges of external supply voltages for a single IC is to turn on a step down regulator (switching or linear) to supply the low voltage core logic of the IC if the external voltage is higher than required by the core. A switch can be turned on to supply the core if the external supply is in the same range as the required core supply. If the external supply is less than the required internal core supply, a boost-switching regulator can be turned on. All these options can be exercised by options set on the application board for a dedicated external supply.

Patent number FR2838840, which is incorporated by reference, suggests using a comparator for comparing the supply with a reference and take decision accordingly. The comparator is kept on all the time, but the operator IC generates lots of noise and may cause erroneous switching of the comparator and may cause lots of noise on the internal supply line, especially, when two ranges of the supply are so that the lower limit of the higher supply range is relatively close to the higher limit of the lower supply range.

Furthermore, during the power up phase, when the decision-making circuit is not fully activated, then an erroneous supply-management decision, however momentary, may expose low-voltage components to a high voltage.

SUMMARY

A need has arisen for a circuit that identifies the external supply range automatically and registers a value only once at the power up corresponding to the identified external supply voltage rather than catering to variable supply voltage as in the case of battery voltage dropping from one range to the other.

An embodiment of the present invention provides accurate supply-voltage-range identification.

Another embodiment of the present invention registers the status of the external supply voltage and makes the decision immune to any switching noise generated from the logic circuit during normal operation of the integrated circuit.

Another embodiment of the present invention avoids erroneous supply management decisions during a power-up phase.

Another embodiment of the present invention minimizes power consumption.

An embodiment of the present invention provides a supply voltage identifier comprising:

supply voltage sensing means incorporating enable/disable input and receiving supply voltage, a reference generator incorporating enable/disable input for generating reference voltage, a comparison means having first input connected to the output of said sensing means, a second input connected to said reference generator and a third input for enabling/disabling its operation, a registering means connected to the output of said comparison means at its first input for storing the comparison output, a selecting means having a first input connected to the supply voltage, a second input connected to the output of a voltage regulating means, a third input for enabling/disabling and a selection input connected to the output of said registering means, a control means having a first output coupled to the enable/disable input of each of said supply voltage sensing means, reference generator, comparison means, a second output connected to said third input of said selecting means and a third output coupled to the store input of said registering means; the arrangement being such that said selecting means is disabled by said control means on receipt of a control signal at the input of said control means, said supply voltage sensing means, reference generator, comparison means are enabled for a predefined period, after which the output of each comparison means is stored in each corresponding registering means, and finally the selection means are enabled, and said supply voltage sensing means, reference generator, comparison means are disabled.

In one embodiment, the said supply voltage sensing means is a voltage divider circuit.

In one embodiment, the said comparison means is an offset compensated comparator.

In one embodiment, the said registering means comprising latches.

In one embodiment, the said control means comprises an oscillator connected at the clock input of a finite state machine.

In one embodiment, the said control means comprises an additional control input for disabling itself after disabling said supply voltage sensing means, comparison means, and reference generator.

An embodiment of the present invention also provides a method for supply-voltage identification comprising steps of:

disabling the output of the supply voltage identifier, sensing the supply voltage, comparing the sensed supply voltage with one or more reference voltages, after supply voltage and reference voltages settle, storing the results of the comparisons, enabling the selection of either the input supply voltage or a regulated voltage output based on the stored results, and disabling sensing and comparison of the supply voltage and the oscillator.

Another embodiment of the invention is a supply voltage identifier comprising:

one or more sets of:

supply voltage sensing means incorporating enable/disable input and receiving supply voltage, a reference generator incorporating enable/disable input for generating reference voltage, a comparison means having first input connected to the output of said sensing means, a second input connected to said reference generator and a third input for enabling/disabling its operation, a registering means connected to the output of said comparison means at its first input for storing the comparison output, a selecting means having a first input connected to the supply voltage, a second input connected to the output of a voltage regulating means, a third input for enabling/disabling and a selection input connected to the output of said registering means, a control means having a first output coupled to the enable/disable input of each of said supply voltage sensing means, reference generator, comparison means, a second output connected to said third input of said selecting means and a third output coupled to the store input of said registering means; the arrangement being such that said selecting means is disabled by said control means on receipt of a control signal at the input of said control means, said supply voltage sensing means, reference generator, comparison means are enabled for a predefined period, after which the output of each comparison means is stored in each corresponding registering means, and finally the selection means are enabled, and said supply voltage sensing means, reference generator, comparison means are disabled.

Thus, an embodiment of the present invention provides a supply-voltage identifier, which measures the external supply voltage at power on or at chip enable, only once and registers the value for a proper supply-management decision for the remaining time of the operation and switches itself off so that it is immune to switching noise of the IC in normal operation, and to reduce power consumption. It also avoids any erroneous decision, even momentary, during power up, by keeping the decisions in an inactive state until power-on events settle, and then making the decision for supplying the required voltage to the core of the integrated circuit.

BRIEF DESCRIPTION OF THE DRAWINGS

FIG. 1 is a block diagram of the supply-voltage management to supply an internal core of an IC according to an embodiment of the invention.

FIG. 2 is a detailed circuit diagram of a supply identifier in accordance with an embodiment of the invention.

FIG. 3 illustrates the control signals of a supply identifier according to an embodiment of the instant invention.

FIG. 4 illustrates multiple-range supply identification in accordance with an embodiment of the invention.

DETAILED DESCRIPTION

Figure 1A:
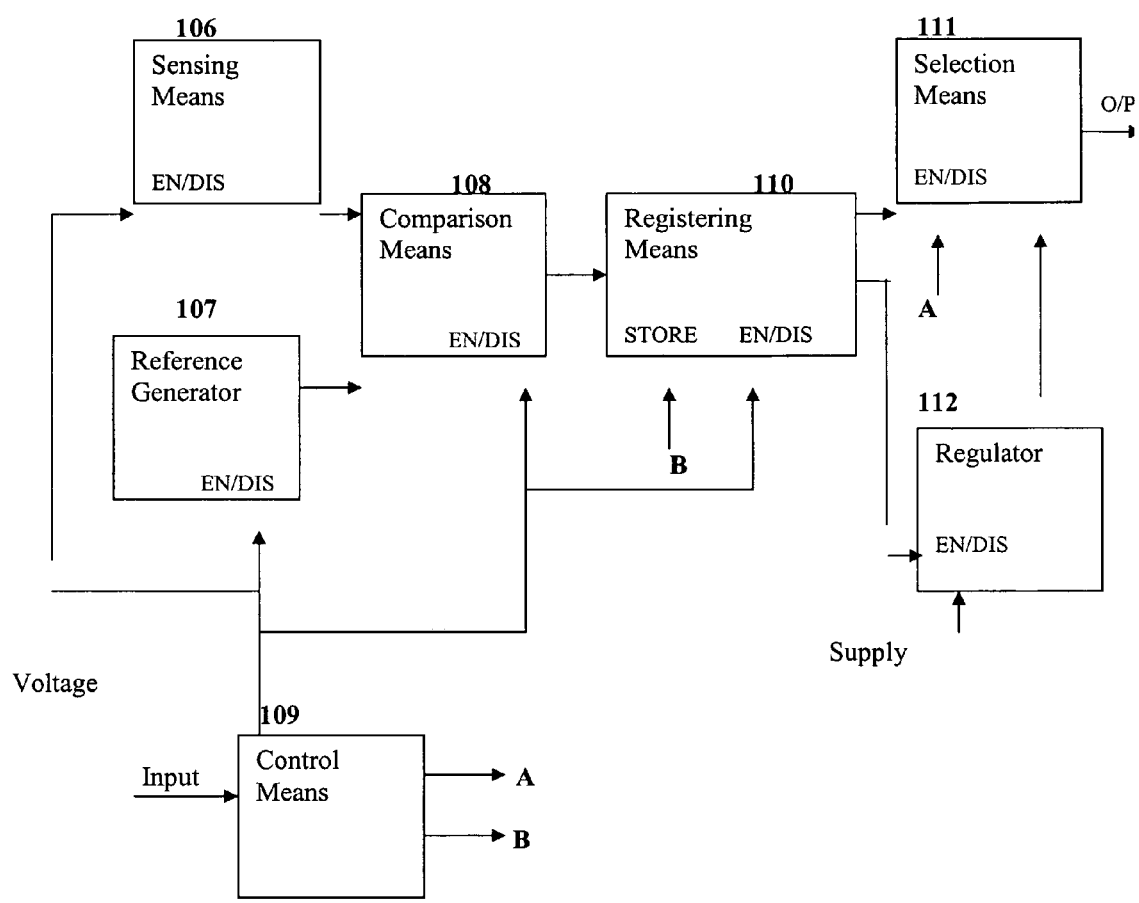
FIG. 1A is a block diagram of a supply identifier in accordance with another embodiment of the instant invention.

The supply identifier (100), as shown in FIG. 1 according to an embodiment of the invention, is used to determine at power up or at chip enable CE (101), whether external voltage Vext (102) is greater than a predetermined threshold, in which case the regulator (103) is turned on to supply internal voltage Vint (104). If Vext is less than the predetermined threshold, which means that the external voltage is in the same range as the internal voltage, then switch (105), is turned on to connect Vext to Vint. This concept can be extended to multiple regulators, step down or step up, as well as to switches that cater to multiple ranges of the external supply voltage, i.e., greater than Vint, equal to Vint as well as less than Vint.

FIG. 1A shows a block diagram representation of the supply identifier 100 of FIG. 1 according to an embodiment of the invention, wherein sensing means (106) are used to generate a fraction of the external supply voltage. The comparison means (108) are used to compare the fraction of the external supply voltage generated by the sensing means (106) and the reference voltage generated from the reference generator (107). The control means (109) is used to generate the enable and disable signals for the sensing means 106, reference generator 107, and comparison means 108, wherein the sensing means, reference generator and comparison means are disabled after the supply voltage is compared and stored in registering means (110). The stored output is used to provide the final output through the selection means (111), which is disabled at the commencement of the supply-voltage identification, and is enabled after the comparison output is generated. In accordance with the comparison output, the selection means (111) selects the regulated output (112) or the supply voltage for generating the final output voltage at O/P.

FIG. 2 shows the detailed circuit of the supply identifier 100 of FIGS. 1 and 2 according to an embodiment of the invention. The identifier 100 makes a decision at the beginning of the operation, registers the decision, and turns itself off for supplying the identified external supply voltage to the core of the integrated circuit. The supply identifier 100 includes a switched capacitor comparator (200), for offset-cancelled precise comparison between reference voltage (201), and a fraction of the external voltage (Vext)=k*Vext 202, wherein k*Vext is derived through a resistor-divider network (203).

At power up, the Power On Reset (POR 204) generates a power-on-reset signal with a threshold lower than the minimum allowed supply, provided CE (205)=1 (or tied to the Vext). The POR can be kept independent of the CE control, but power consumption would occur when CE=0. POR output is combined with chip enable CE in the combinational circuit (206) for generating a reset signal nrst (207). nrst resets the decision registers for Switch enable (SwtEn 208), and regulator enable (RegEn 209), to their respective inactive states for avoiding any erroneous decision until the external supply Vref (201) and the comparator (200) settle to their respective operational levels. Further, the reset signal nrst also resets the finite state machine (FSM 210). There is a crude oscillator (211), which generates the clock for the FSM. The FSM in turn generates the control signals for the comparator (200) and the registers (208, 209). The control signals include φ1 212 and φ2 213, for the switched-capacitor comparator 200. The FSM also generates (214) for the registers (208) and (209), and finally a stop signal (215) for the circuit to switch itself off after the decision has been made. The CE and stop signal are combined in logic (216) to generate a power down (PD 217) signal for disabling the supply-voltage identifier 100.

When CE=0 even after the power up, the circuit is switched off by PD generated through logic (216); the FSM (210) and the registers 208 & 209 are reset by nrst generated by the logic (206). The reset states of SwtEn and RegEn make sure that neither the regulator (103) nor the switch (105) (FIG. 1) is activated, and Vint (104) is cut off, i.e., is floating. The PD signal 217 ensures minimum power consumption. When CE goes high, the circuit becomes active, turns on the reference (201), comparator (200), oscillator (211) and the resistor divider network (203).

When CE is tied to the external supply voltage Vext, i.e., CE=Vext, then POR (204) provides the reset state to FSM and to the registers. There is no power down (PD) signal generated at the beginning, hence the oscillator (211), Vref (201) generator, resistor divider (203), and comparator (200) turn on immediately.

After a fixed delay (ensured by FSM 210), the decision on the value of the external supply is taken through the comparator 208, by comparing the fraction of the Vext, i.e., k*Vext (202), with Vref (201), where k=R2/(R1+R2). The switched-capacitor comparator operates on two non-overlapping phase signals, φ1 212, and φ2 213 in a conventional manner. The output of the comparator during phase (φ2) is stored in register SwtEn (208), and RegEn (209) at the rising edge of the strobe. Either the regulator (103), or the switch (105) of FIG. 1 turns on to properly supply the internal core voltage Vint (104).

After the decision is made, the PD signal switches off the oscillator (211), the Vref generator (201), the comparator (200) and the resistor divider (203). It does not generate a reset, hence the decision registered in the SwtEn (208) and in the RegEn (209) registers remains for the rest of the period of operation until CE=0 or power off. During the normal operation period of the IC no further comparison is made. Thus, the supply identifier 100 is made immune to noise, which is invariably generated once the internal core logic starts working in any IC. Here the decision is stored before the core logic of the IC even gets the supply. If the supply identifier 100 is kept on, this noise may cause the malfunctioning of the comparator, when the IC is operational and can induce a wrong value for the Vint power supply.

Almost the entire supply-identifier circuit (100) is powered down apart from the low-power consuming POR (204) circuit after deciding the range of the external supply voltage. Hence, during normal mode of the operation of the IC, the supply identifier 100 consumes very little power.

Further, the circuit described according to this embodiment works in the entire supply range for the core of the integrated circuit. It takes advantage of the higher voltage transistors usually provided in common CMOS processes with dual gate oxide, along with the lower voltage compliant transistors used in the core section of the IC.

FIG. 3 shows the control signal generation and their relative timing relations with respect to their logic values ("high" represented by 300 and "low" represented by 301) generated by the finite state machine (FSM, 210 of FIG. 2) and associated circuitry. FIG. 3(a) describes the case when chip enable, CE (205) is not connected to the external supply, and it is asserted later than settling time of the external voltage Vext. Here, supply-rise (Vext) cannot cause a power on reset pulse, as POR (204) is disabled by CE. The reset signal (nrst 303), remains low as long as CE is low, for providing a reset to FSM(210) and the registers (208, 209). During this time PD is also high (308) ensuring little or no power consumption. Once CE goes high, nrst and PD are deactivated and the oscillator 211 starts generating the clock (CK). The threshold voltage Vref rises to a designed value (it is not same as the "high" level). A Power on Reset (Vpor) signal may not be generated and may be of no consequence as CE=0 ensures proper reset. The offset-storing phase of the comparator, φ1, remains high until Tstrt (304) time. The power on reset value of φ1 is high for this time. The time shall be such that before the external supply voltage value is attained for the core supply, the reference and the comparator attain their operational level. The power on reset value of the SwtEn (208) and the RegEn (209) are in an inactive phase until the operational level is attained by the external supply voltage and by the external reference so that the core of the integrated circuit does not get any supply (Vint, 104). Thus, there is no chance of a wrong decision at the power up, even momentarily, else it may expose the internal low-voltage transistors to a higher supply. When φ1 goes low, the comparison phase (φ2) goes high only after a non-overlapping time (Tno 305). The strobe signal is set high only after the comparator delay (Tcd 306) this is the signal, which acts as the clock to the SwtEn & RegEn registers. After a short period (Tcl 307), the stop signal is set high by the FSM, which in turn generates the power down signal (309) to stop the clock (CK). In one embodiment, Tcl is less than the time when the core logic starts generating switching noise or the strobe signal is regenerated. Hence the state of the signals generated by the FSM and value registered in the decision registers do not change for the rest of the IC operation.

If chip enable (CE) is tied to Vext, then the timing diagram shows a slight difference from FIG. 3(a), as shown in FIG. 3b according to an embodiment of the invention. The reset signal, nrst (310), is generated only during the Vpor (302) pulse. The initial pulse of PD (308) is not generated, but the later part (311) is generated similar to that in FIG. 3(a). In FIGS. 3a and 3b, the delays shown as Tstrt, Tno are multiples of the time period of CK.

In an embodiment, in FIG. 4, it is shown how the concept of FIG. 2 can be extended to multiple external supply range selection. Here, a multi-tapped resistor chain, (400), provides the different fractions of Vext as, k1.Vext . . . km.Vext. These values are compared with single reference voltage (Vref) in multiple comparators and register sections (401, 402) which in turn provide decisions as D1, nD1, . . . , Dm, nDm. The control signals and the reference voltage are similar to those of FIG. 2 and FIG. 3. The combination logic (403) makes the final decision to turn on the suitable regulator (step up or step down), and the switch as well if indicated by reg1En, reg2En . . . regmEn signals. A limitation of the multiple-range identification is that the supply identifier circuits may have to work with a wide range of Vext. It is, needless to say, as the control signals are the same as before, the circuit also turns itself off after the decision is made, and is hence immune to logic switching noise and consumes minimal power in normal operation of the IC.

The supply-identifier circuits of FIGS. 1, 1a, 2, and 4 may be incorporated in an integrated circuit, which may be incorporated in a system such as a computer system.

From the foregoing it will be appreciated that, although specific embodiments of the invention have been described herein for purposes of illustration, various modifications may be made without deviating from the spirit and scope of the invention.

We claim:

1. A supply voltage identifier comprising:
   supply voltage sensing means incorporating enable/disable input and receiving supply voltage,
   a reference generator incorporating enable/disable input for generating reference voltage,
   a comparison means having first input connected to the output of said sensing means, a second input connected to said reference generator and a third input for enabling/disabling its operation,
   a registering means connected to the output of said comparison means at its first input for storing the comparison output,
   a selecting means having a first input connected to the supply voltage, a second input connected to the output of a voltage regulating means, a third input for enabling/disabling and a selection input connected to the output of said registering means, a control means having a first output coupled to the enable/disable input of each of said supply voltage sensing means, reference generator, comparison means, a second output connected to said third input of said selecting means and a third output coupled to the store input of said registering means; the arrangement being such that said selecting means is disabled by said control means on receipt of a control signal at the input of said control means, said supply voltage sensing means, reference generator, comparison means are enabled for a predefined period, after which the output of each comparison means is stored in each corresponding registering means, and finally the selection means are enabled, and said supply voltage sensing means, reference generator, comparison means are disabled.

2. A supply voltage identifier as claimed in claim 1, wherein said supply voltage sensing means is a voltage divider circuit.

3. A supply voltage identifier as claimed in claim 1, wherein said comparison means is an offset compensated comparator.

4. A supply voltage identifier as claimed in claim 1, wherein said registering means comprising latches.

5. A supply voltage identifier as claimed in claim 1, wherein said control means comprising an oscillator connected at the clock input of a finite state machine.

6. A supply voltage identifier as claimed in claim 1, wherein said control means comprising an additional control input for disabling itself after disabling said supply voltage sensing means, comparison means and reference generator.

7. A method for supply voltage identification comprising steps of:
disabling the output of the supply voltage identifier,
sensing the supply voltage,
comparing the sensed supply voltage with one or more reference voltages, after supply voltage and reference voltages settle,
storing the results of the comparisons,
enabling the selection of either the input supply voltage or a regulated voltage output based on the stored results, and
disabling sensing and comparison of the supply voltage and the oscillator.

8. A supply voltage identifier comprising:
one or more sets of:
supply voltage sensing means incorporating enable/disable input and receiving supply voltage,
a reference generator incorporating enable/disable input for generating reference voltage,
a comparison means having first input connected to the output of said sensing means, a second input connected to said reference generator and a third input for enabling/disabling its operation,
a registering means connected to the output of said comparison means at its first input for storing the comparison output,
a selecting means having a first input connected to the supply voltage, a second input connected to the output of a voltage regulating means, a third input for enabling/disabling and a selection input connected to the output of said registering means,
a control means having a first output coupled to the enable/disable input of each of said supply voltage sensing means, reference generator, comparison means, a second output connected to said third input of said selecting means and a third output coupled to the store input of said registering means; the arrangement being such that said selecting means is disabled by said control means on receipt of a control signal at the input of said control means, said supply voltage sensing means, reference generator, comparison means are enabled for a predefined period, after which the output of each comparison means is stored in each corresponding registering means, and finally the selection means are enabled, and said supply voltage sensing means, reference generator, comparison means are disabled.

9. An integrated circuit, comprising:
circuitry;
a power supply operable to generate a first supply voltage;
a selection circuit operable to select as a supply signal for the circuitry one of the first supply voltage and a second supply voltage generated outside of the integrated circuit; and
a programmable circuit coupled to the selection circuit, operable to attain a state corresponding to the selected supply voltage, and operable to couple the selected supply voltage to the circuitry while in the state.

10. The power manager of claim 9 wherein the programmable circuit comprises a storage element operable to store a value corresponding to the selected power source.

11. The power manager of claim 9, further comprising a control circuit operable to hold the programmable circuit in the state corresponding to the selected power source.

12. A power manager, comprising:
a selection circuit operable to select a power source for another circuit;
a programmable circuit coupled to the selection circuit, operable to attain a state corresponding to the selected power source, and operable to couple the power source to the second circuit while in the state; and
wherein the selection circuit comprises a comparator circuit operable to
compare a first supply voltage generated by a first power supply to a second supply voltage generated by a second power supply,
select the first power supply as the power source if the first supply voltage has a first relationship to the second supply voltage, and
select the second power supply as the power source if the first supply voltage has a second relationship to the second supply voltage.

13. A power manager, comprising:
a selection circuit operable to select a power source for another circuit;
a programmable circuit coupled to the selection circuit, operable to attain a state corresponding to the selected power source, and operable to couple the power source to to the other circuit while in the state; and
a control circuit operable to disable the selection circuit after the programmable circuit attains the state corresponding to the selected power source.

14. A power manager, comprising:
a selection circuit operable to select a power source for another circuit;
a programmable circuit coupled to the selection circuit, operable to attain a state corresponding to the selected power source, and operable to couple the power source to the second circuit while in the state;

a regulator operable to generate a regulated supply voltage from a main supply voltage that is generated by a main power supply; and wherein the selection circuit comprises a comparator circuit operable
to compare the regulated supply voltage to the main supply voltage,
to select the regulated power supply as the power source if the regulated supply voltage has a first relationship to the main supply voltage, and
to select the main power supply as the power source if the regulated supply voltage has a second relationship to the main supply voltage.

15. An integrated circuit, comprising:
an external-supply node operable to receive an external-supply voltage generated by a power supply that is external to the integrated circuit;
a regulator coupled to the external-supply node and operable to generate a regulated voltage from the external-supply voltage;
an internal-supply node;
circuitry coupled to the internal-supply node;
a selection circuit coupled to the external-supply node, operable to measure the external-supply voltage, and, based on the measurement, operable to select one of the external-supply voltage and the regulated supply voltage for powering the circuitry; and
a storage circuit operable to store a value corresponding to the selected one of the external-supply voltage and the regulated voltage and to provide the selected one of the external-supply voltage and the regulated voltage on the internal-supply node.

16. The integrated circuit of claim 15 wherein the circuitry comprises a memory core.

17. The integrated circuit of claim 15 wherein the circuitry comprises a processor core.

18. The integrated circuit of claim 15 wherein the circuitry comprises a logic core.

19. The integrated circuit of claim 15 wherein the selection circuit is operable to select the external-supply voltage if the external-supply voltage has a first relationship to a reference voltage and is operable to select the regulated voltage if the external-supply voltage has a second relationship to the reference voltage.

20. The integrated circuit of claim 15 wherein the selection circuit is operable to generate the value stored by the storage circuit.

21. The integrated circuit of claim 15, further comprising:
a switch coupled between the external-supply and internal-supply nodes and coupled to the storage circuit;
wherein the regulator is coupled to the internal-supply node; and
wherein the storage circuit is operable to,
provide the external-supply voltage on the internal-supply node by closing the switch and disabling the regulator, and
provide the regulated voltage on the internal-supply node by enabling the regulator and opening the switch.

22. The integrated circuit of claim 15, further comprising a control circuit operable to disable the selection circuit in response to the selection circuit selecting one of the external-supply voltage and the regulated supply voltage for powering the circuitry.

23. The integrated circuit of claim 15, further comprising a control circuit operable to maintain the value within the storage circuit.

24. A system, comprising:
an integrated circuit, including,
an external-supply node operable to receive an external-supply voltage generated by a power supply that is external to the integrated circuit;
a regulator coupled to the external-supply node and operable to generate a regulated voltage from the external-supply voltage;
an internal-supply node;
circuitry coupled to the internal-supply node;
a selection circuit coupled to the external-supply node, operable to measure the external-supply voltage, and, based on the measurement, operable to select one of the external-supply voltage and the regulated supply voltage for powering the circuitry; and
a storage circuit operable to store a value corresponding to the selected one of the external-supply voltage and the regulated voltage and to provide the selected one of the external-supply voltage and the regulated voltage on the internal-supply node.

25. A method, comprising:
selecting as a direct power source for a circuit disposed on an integrated circuit one of a first power supply disposed on the integrated circuit and a second power supply disposed external to the integrated circuit;
saving an identity of the selected power source; and
coupling the selected power source to the circuit in response to the saved identity.

26. The method of claim 25 wherein saving the identity of the selected power source comprises storing a value that represents the identity of the selected power source.

27. The method of claim 25 wherein coupling the selected power source to the circuit comprises activating a voltage regulator that composes the first power supply if the first power supply is selected as the power source.

28. The method of claim 25 wherein coupling the selected power source to the circuit comprises closing a switch disposed on the integrated circuit between the second power supply and the circuit if the second power supply is selected as the power source.

29. A method, comprising:
selecting a power source for a circuit;
saving an identity of the selected power source;
coupling the selected power source to the circuit in response to the saved identity; and
wherein selecting the power source comprises:
comparing a first supply voltage to a predetermined reference voltage,
selecting a second supply voltage as the power source if the first supply voltage is related to the predetermined reference voltage in a first predetermined manner, and
selecting a third supply voltage as the power source if the first supply voltage is related to the predetermined reference voltage in a second predetermined manner.

30. A method, comprising:
selecting a power source for a circuit;
saving an identity of the selected power source;
coupling the selected power source to the circuit in response to the saved identity; and
wherein selecting the power source comprises,
comparing a first supply voltage to a predetermined reference voltage;

selecting the first supply voltage as the power source if the first supply voltage is related to the predetermined reference voltage in a first predetermined manner; and selecting a second supply voltage as the power source if the first supply voltage is related to the predetermined reference voltage in a second predetermined manner.

31. A method, comprising:
selecting a power source for a circuit;
saving an identity of the selected power source;
coupling the selected power source to the circuit in response to the saved identity; and
halting the selecting of the power source after saving the identity of the selected power source.

32. A method, comprising:
selecting a power source for a circuit with a selection circuit;
saving an identity of the selected power source;
coupling the selected power source to the circuit in response to the saved identity; and
disabling the selection circuit after saving the identity of the selected power source.

33. A power manager, comprising:
a selection circuit operable to select a power source for another circuit;
a programmable circuit coupled to the selection circuit, operable to attain a state corresponding to the selected power source, and operable to couple the power source to to the other circuit while in the state; and
a control circuit operable to cause the selection circuit to draw substantially no supply current after the programmable circuit attains the state corresponding to the selected power source.

34. A method, comprising:
selecting a power source for a circuit with a selection circuit;
saving an identity of the selected power source;
coupling the selected power source to the circuit in response to the saved identity; and
causing the selection circuit to consume substantially no power after saving the identity of the selected power source.

* * * * *

UNITED STATES PATENT AND TRADEMARK OFFICE
CERTIFICATE OF CORRECTION

| | | |
|---|---|---|
| PATENT NO. | : 7,382,064 B2 | Page 1 of 1 |
| APPLICATION NO. | : 11/296589 | |
| DATED | : June 3, 2008 | |
| INVENTOR(S) | : Pooja Jaisinghani and Tapas Nandy | |

It is certified that error appears in the above-identified patent and that said Letters Patent is hereby corrected as shown below:

Column 12 Claim 33 line 7 delete the second "to"

Signed and Sealed this

Twenty-first Day of October, 2008

JON W. DUDAS
*Director of the United States Patent and Trademark Office*